US006229101B1

(12) United States Patent
Sekiya et al.

(10) Patent No.: US 6,229,101 B1
(45) **Date of Patent: *May 8, 2001**

(54) SUBSTRATE FOR MOUNTING ELECTRONIC PART

(75) Inventors: Masataka Sekiya; Tsunehisa Takahashi; Akihiro Demura; Takuji Asai, all of Ohgaki (JP)

(73) Assignee: Ibiden Co. Ltd., Ohgaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/329,228

(22) Filed: Jun. 10, 1999

Related U.S. Application Data

(63) Continuation of application No. 08/766,312, filed on Dec. 13, 1996, now Pat. No. 6,011,222.

(30) Foreign Application Priority Data

Dec. 15, 1995 (JP) .................................................. 7-347629
Dec. 12, 1996 (JP) .................................................. 8-352966

(51) Int. Cl.[7] ............................... H05K 1/18; H01R 9/09

(52) U.S. Cl. ......................... 174/266; 174/265; 174/267; 257/734; 361/772; 439/46; 439/83; 439/84

(58) Field of Search .................................... 174/265, 266, 174/267, 263; 257/694, 739, 734; 361/772, 773, 774; 439/45, 46, 75, 81, 82, 83, 84

(56) References Cited

U.S. PATENT DOCUMENTS

| | | | |
|---|---|---|---|
| 4,877,176 | 10/1989 | Kubis | 228/173.5 |
| 5,035,656 | 7/1991 | Patel | 439/733.1 |
| 5,135,403 | 8/1992 | Rinaldi | 439/82 |
| 5,656,798 | 8/1997 | Kubo et al. | 174/265 |
| 6,011,222 * | 1/2000 | Sekiya et al. | 174/266 |

FOREIGN PATENT DOCUMENTS

| | | |
|---|---|---|
| 0 331 293 | 9/1989 | (EP) . |
| 60-101998 | 6/1985 | (JP) . |
| 61-4456 | 1/1986 | (JP) . |
| 62-266858 | 11/1987 | (JP) . |
| 62-283651 | 12/1987 | (JP) . |
| 871411 | 6/1993 | (JP) . |
| 913869 | 11/1994 | (JP) . |
| 8-148205 | 6/1996 | (JP) . |
| 8-213069 | 8/1996 | (JP) . |

* cited by examiner

*Primary Examiner*—Hyung Sub Sough
(74) *Attorney, Agent, or Firm*—Oblon, Spivak, McClelland, Maier & Neustadt, P.C.

(57) ABSTRACT

A substrate for mounting an electronic part and a method for producing the same, which allows a conductive pin to be inserted and secured in a through hole without exerting any damage thereto. The substrate for mounting an electronic part is formed of a through hole piercing an insulating substrate and a conductive pin with its head inserted into the through hole. The head of the conductive pin is provided with a plurality of projections to its side wall, each projecting radially in 4 or more directions. Those projections form a plurality of pairs, each of which is extending in an opposite direction from an axial center of the head. Those projection pairs include a primary projection pair having a largest length and a secondary projection pair having a second largest length. The length of the primary projection pair is equal to or more than an inside diameter of the through hole. The length of the secondary projection pair is less than the inside diameter of the through hole.

10 Claims, 11 Drawing Sheets

| SAMPLE | | SOLDER PRINTING PATTERN | OFF-SET AMOUNT (mm) | SOLDER AMOUNT (mm) | EVALUATION ITEM | | | | |
|---|---|---|---|---|---|---|---|---|---|
| | | | | | PRINTING STABILITY | GROSS AREA OF VOID ($mm^2$) | LAND WET | CONVEX PIN (%) | CONCAVE PIN (%) |
| A | SINGLE CIRCLE PATTERN |  | 0 | φ0. 95 | ○ | 1. 20 | ○ | 0 | 11.0 |
| B | | | 0. 6 | | ◎ | 0. 56 | X | 0 | 11.0 |
| C | | | 0 | φ1. 05 | ○ | —— | —— | —— | —— |
| D | | | 0. 3 | | ◎ | 0. 90 | X | 0. 17 | 4. 2 |
| E | | | 0. 6 | | ◎ | 0. 43 | X | 0. 08 | 0. 7 |
| F | | | 0. 6 | φ1. 20 | ◎ | 3. 50 | ○ | 8. 45 | 0 |
| G | GLASS TYPE PATTERN |  | | φ0. 8 X 2 | ○ | 2. 80 | ○ | 0. 51 | 0 |
| H | SEMI-CIRCLE PATTERN |  | | φ1. 05 | X | —— | ○ | 0. 11 | 90. 0 |

SUBSTRATE FOR MOUNTING ELECTRONIC PART

This application is a Continuation of application Ser. No. 08/766,312 filed on Dec. 13, 1996 now U.S. Pat. No. 6,011,222.

BACKGROUND OF THE INVENTION

1. Field of the Invention

The present invention relates to a substrate for mounting an electronic part, allowing a conductive pin to be inserted and secured in a through hole firmly, a method for producing such substrate and the conductive pin and particularly, to a structure of the conductive pin.

2. Description of the Related Arts

Referring to FIGS. 16 and 17, a conventional substrate 9 for mounting an electronic part is composed of an insulating substrate 90, a recessed space 95 in a center of the insulating substrate 90 where an electronic part is mounted and a frame-like dam 98 formed around the periphery of the recessed space 95. Reference numerals 93 and 94 designate a conductive circuit and a land, respectively.

A head 921 of a conductive pin 92 is inserted into a through hole 91 so that the head 921 is electrically connected to a plating layer 911 coated with an inner wall of the through hole 91. The conductive pin 92 is provided with a collar 922 and a leg 923. The conductive pin 92 inserted into each corner of the insulating substrate 90 is further provided with a lower collar 924.

Referring to FIG. 17, the head 921 of the conductive pin 92 is bonded to the through hole 91 by soldering of a solder 8 in order to reinforce the electric bonding and further to provide mechanical strength between the conductive pin 92 and the through hole 91.

The soldering is executed by using a reflow method as shown in FIG. 17. That is, the solder 8 melted into a molten state is supplied in the direction opposite to the insertion of the conductive pin 92.

More specifically, as shown in FIG. 18, the head 921 of the conductive pin 92 is inserted into the through hole 91 of the insulating substrate 90, on which a solder paste 81 formed of solder particles, flux or the like is placed and then heated for melting. The molten solder 8 flows into a solder gap defined by the through hole 91 and the head 921 for bonding therebetween (See FIG. 17).

The above-described substrate 90 for mounting an electronic part is of a face down type, in which the conductive pin is inserted from the same surface where the recessed space 95 for mounting an electronic part is formed.

In the above conventional art, the smaller the diameter of the head 921 of the conductive pin 92 becomes, the easier the head 921 can be inserted into the through hole 91. In case the diameter of the head 921 is too small, the conductive pin 92 is likely to fall out from the through hole 91 in the middle of the soldering process. While in case the diameter of the head 921 is too large for tight fitting, the conductive pin 92 cannot be fully inserted, failing to have the collar 922 abutted on the land 94, or an inner wall of the through hole 91 might be cracked or the plating layer coated with the inner wall surface of the through hole 91 might be peeled off because of strong pressure exerted to the inner wall during insertion.

SUMMARY OF THE INVENTION

It is an object of the present invention to provide a substrate for mounting an electronic part, a producing method thereof and a conductive pin, by which the conductive pin can be inserted and secured firmly without damaging a through hole.

The present invention is realized by a substrate for mounting an electronic part comprising an insulating substrate provided with a conductive circuit, a through hole formed in the insulating substrate and a conductive pin having a leg and a head inserted into the through hole. The head of the conductive pin is provided with a plurality of projections at its side wall, each projecting radially in 4 or more directions. The projections form a plurality of projection pairs, each projection of which is extending in an opposite direction from an axial center of the head. The projection pairs include a primary projection pair having the largest length and a secondary projection pair having the next largest length. The length of the primary projection pair is equal to or more than an inside diameter of the through hole. The length of the secondary projection pair is less than the inside diameter of the through hole.

DETAILED DESCRIPTION OF THE DRAWINGS

DETAILED DESCRIPTION OF THE INVENTION

Figure 1:
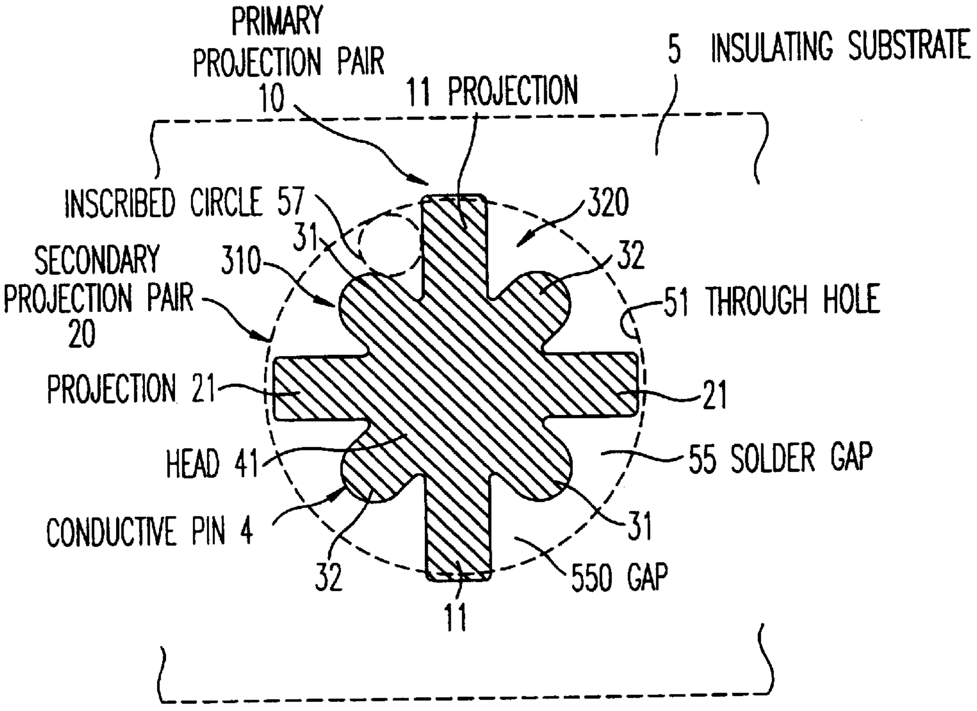
FIG. 1 is a sectional view taken on line A—A of FIG. 2, representing a head of a conductive pin inserted into a through hole of Embodiments 1 and 2.
Figure 2:
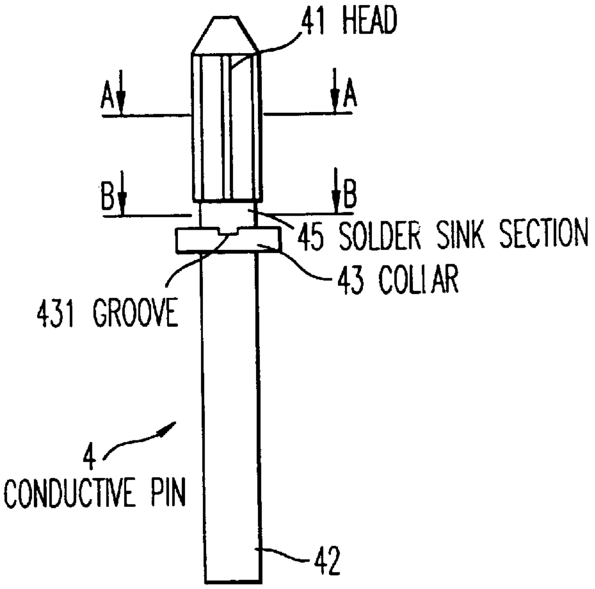
FIG. 2 is a front view of the conductive pin of Embodiments 1 and 2.
Figure 3:
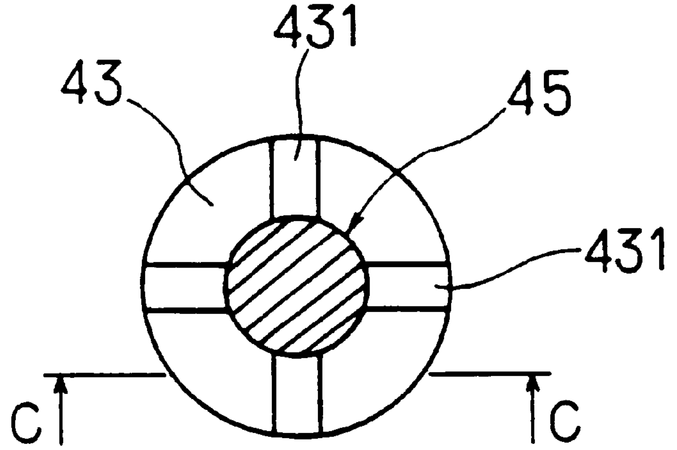
FIG. 3 is a sectional view taken on line B—B of FIG. 2 of Embodiment 1 and 2.

The most important feature of the present invention is a conductive pin having radial projections at a side wall of its head, taking 4 or more directions. Those projections form a plurality of projection pairs each extending diametrically. A primary projection pair (the longest projection pair) has a length equal to or more than the inside diameter of the through hole. A secondary projection pair (the second longest projection pair) has a length less than the inside diameter of the through hole.

The above-described projection denotes each piece radially projecting from the side wall of the conductive pin. The projection pair denotes a pair of radial projections each extending from an axial center of the head of the conductive pin in the opposite direction, i.e., diametrically. Two or more projection pairs are provided. A length of the projection pair is defined from one outer end of a projection to the opposite outer end of the other projection. In other words, the length of the projection pair is obtained by summing up each length of the projections and the diameter of the head.

One set of projections is designated as a primary projection pair. Another set of projections is designated as a secondary projection pair. In case the conductive pin has two projection pairs, one should be the primary projection pair and the other should be the secondary projection pair. In case the conductive pin has three or more projection pairs, each projection pair other than the primary projection pair and the secondary projection pair has the length less than that of the secondary pair.

As those projection pairs are normally formed in pairs, in case the odd number of projections, for example, 5 or 7, are provided, 2 or 3 projection pairs are obtained and one projection is left, forming no projection pair.

In case the odd projections are provided in which each projection is radially arranged at an equal angle, the projection is paired with the nearest projection with respect to the diametric line.

The conductive pin is formed of a head inserted into a through hole of the insulating substrate and a leg inserted into another substrate such as a mother board or the like. The conductive pin is further provided with a collar between the head and the leg as described later.

In the present invention, a plurality of projections are provided with a head of the conductive pin, which are radially arranged in 4 or more directions. A set of projections each diametrically extending in opposite directions forms a projection pair. The longest projection pair is referred to as a primary projection pair with its length equal to or more than the inside diameter of the through hole. The second longest projection pair is referred to as a secondary projection pair with its length less than the inside diameter of the through hole. The head of the conductive pin can be smoothly inserted into a through hole along a longitudinal axis thereof guided by projection s radially arranged in 4 or more directions. As a result, the head of the conductive pin is not tilted in the insertion direction.

Among the above projections radially arranged in 4 or more directions, a set of projections forms a primary projection pair with its length equal to or more than the inside diameter of the through hole. Another set of projections forms the secondary projection pair with its length less than the inside diameter of the through hole. When inserting the head into the through hole, the primary projection pair serves to slightly exert pressure to the inner wall of the through hole. Therefore the head is strongly secured against the through hole, preventing the conductive pin from falling out.

As the length of the secondary projection pair is less than the inside diameter of the through hole, a distortion of the inner wall of the through hole owing to pressure exerted by the primary projection pair is absorbed at a point where the secondary projection pair is inserted. So the inner wall of the through hole is kept from being damaged.

A solder gap defined by projections arranged in 4 or more directions and the through hole is filled with the solder. The resultant solder has a cross section of a wave-like shape and a vertical section of a tube-like shape as shown in FIG. 1. So the solder filled in the solder gap serves to bond the projections and the through hole for securing the conductive pin firmly.

According to the second aspect of the present invention, it is preferable that a width of a projection tip of the primary projection pair ranges from 50 to 200 $\mu$m. If the width is less than 50 $\mu$m, the primary projection pair cannot be inserted into the inner wall of the through hole sufficiently, thus failing to secure the conductive pin in the through hole firmly. The strength of the conductive pin itself is further reduced, which may deform or damage any of those projections.

While if the width exceeds 200 $\mu$m, increased width of the projection tip is pressed against the inner wall of the through hole. The force securing the conductive pin can be increased. However as the increasing pressure is required for inserting the conductive pin, the conductive pin is not fully inserted (float of the pin) or the inner wall may be damaged.

It is preferable that each projection tip of the primary projection pair is shaped like an arc and the radium of curvature is smaller than that of the inner wall of the through hole. The above shaped and sized projection can be inserted into the through hole firmly without damaging the inner wall thereof.

According to the third aspect of the present invention, it is preferable that the difference of the length between the primary and the secondary projections pairs ranges from 10 to 70 $\mu$m. In the above condition, the distortion of the inner wall of the through hole owing to the pressure exerted by the primary projection pair can be absorbed at a point of the inner wall where the secondary projection pair is inserted in a well-balanced manner. As a result, the head of the conductive pin is secured in the through hole further reliably. If the difference of the length is less than 10 $\mu$m, such difference is so small that the distortion of the inner wall owing to the pressure by the primary projection pair cannot be sufficiently absorbed at a point of the inner wall faced by the secondary projection pair.

If the difference exceeds 70 $\mu$m, the distance between the secondary projection pair and the inner wall of the through hole becomes too large to secure the conductive pin firmly. The above large gap may cause the solder to fall down rather than causing "capillary" action during soldering, resulting in the void within the solder filled in the gap.

According to the fourth aspect of the present invention, the conductive pin is provided with a collar abutting on a surface of the insulating substrate down from the projection.

The abutting surface of the collar is provided with at least one groove formed across the width of the collar.

It is preferable that the solder is applied in a direction opposite to that for inserting the conductive pin to flow through the solder gap between the through hole and the conductive pin so that the through hole and the conductive pin are solder bonded.

When flowing the molten solder material into the solder gap, the air trapped in the solder gap can be exhausted from the groove formed in the collar. As a result, the solder is uniformly filled in the solder gap and no cavity-like solder void is formed therein. The conductive pin is securely bonded to the through hole with the solder, thus providing electric conductive communication reliability for an extended period.

The groove is formed across the width of the collar. The cross section of this groove may be formed into any shape such as a square, arch or the like.

According to the fifth aspect of the present invention, the gross section area of all the grooves formed in the collar ranges from 2 to 40% of the gross section area of the solder gap. The gross section area of the grooves is derived from summing up each section area of the respective grooves. The gross section area of the solder gap denotes a total vertical section area of the solder gap defined by the conductive pin and the inner wall surface of the through hole.

If the gross section area of the grooves is less than 2% of that of the solder gap, it is difficult to exhaust the air trapped in the solder gap through the groove during application of the molten solder into the solder gap. The residual air may cause the void within the solder filled in the solder gap. As a result, the conductive pin cannot be inserted and secured into the through hole firmly. The solder void may cause failure in electric connection between the through hole and the conductive pin.

While if the gross section area of the grooves becomes too large, exceeding 40% of that of the solder gap, the molten solder filled into the gap partially outflows from the solder gap to the groove. Some part of the overflowing solder may further spill toward the outside of the groove. The spilled solder may be adhered to the leg section of the adjacent conductive pin.

The amount of the solder in the solder gap, thus, becomes insufficient and other conductive pins may be stained and damaged with the spilled solder. As the leg section is expected to be inserted into a through hole of a mother board or the like, the stained leg section cannot be fully inserted into the mother board. It may cause the resultant substrate for mounting the electronic part as a whole to be defective.

It is preferable that a groove is formed in the collar and the gross section area of the groove is set to be in the above-specified range in relation with the gross section area of the solder gap. Therefore the solder can be filled with the solder gap defined by the head part of the conductive pin and the through hole successfully, thus securing the conductive pin within the through hole firmly.

According to the sixth aspect of the invention, it is preferable that a section area of one groove formed in the collar ranges from 0.5 to 10% of the gross section area of the solder gap.

If the section area is less than 0.5% of the gross section area of the solder gap, the air trapped therein cannot be exhausted efficiently during application of the solder. While if the section area of the groove exceeds 10% of the gross section area of the solder gap, the solder may overflow and spill from the groove of the collar toward the outside of the through hole.

According to the seventh aspect of the invention, it is preferable that the solder gap between the through hole and the conductive pin inserted thereinto has a space accommodating a virtual inscribed circle contacting with the primary projection pair and the through hole. Preferably the inscribed circle has a diameter ranging from 0.03 to 0.12 mm. Such space accommodating the virtual inscribed circle can be formed by providing the head of the conductive pin with projections as described before. Therefore a tube-like solder gap is formed along with a direction of inserting the head around the head of the conductive pin having the space accommodating the inscribed circle.

If the diameter of the inscribed circle is less than 0.03 mm, the solder cannot be applied smoothly, which may leave some part of the solder gap unfilled. While if the diameter of the inscribed circle exceeds 0.12 mm, the solder gap becomes unnecessarily large, allowing the solder to drop into the through hole all together. The air trapped in the through hole cannot be exhausted insufficiently, resulting in the void within the applied solder.

It is preferable that the projection is twisted in a direction of inserting the conductive pin. In other words, the projections are arranged spirally to the head of the conductive pin just like a thread of a screw. Once being inserted, the conductive pin will not fall off. Also the solder will not drop down all together. As a result, the air trapped in the solder gap can be exhausted, thus decreasing the formation of the void within the solder.

According to the eighth aspect of the invention, it is preferable to provide a solder sink section with the head of the conductive pin between the projection and the collar. The solder sink section has its length less than that of the secondary projection pair and no projections provided therewith. That is, a space having no projection is formed between a lower end of the projection and the collar as a ring shaped solder sink. The molten solder applied from one solder gap 550 (FIG. 1) is raised through another solder gap through the solder sink. The trapped air can be fully exhausted and the formation of the solder void can be decreased.

In the ninth aspect of the invention, the length of the solder sink, i.e., the space of the head provided with no projections, preferably ranges from 2 to 35% of that of the through hole. If the length is less than 2%, exhaustion of the air trapped in the solder gap is insufficient, forming the solder void within the solder. While if the length exceeds 35%, it is difficult to keep the inserted conductive pin parallel to the inner wall of the through hole.

The tenth aspect of the invention is realized by a method for producing a substrate for mounting an electronic part comprising a step of using a conductive pin provided with a head and a leg and inserting the head of the conductive pin into a through hole formed of an insulating substrate provided with a conductive circuit; and a step of applying a solder material into a solder gap defined by the head of the conductive pin and the through hole for solder bonding the conductive pin and the through hole. The head of the conductive pin is provided with projections to its side wall, each projecting radially in 4 or more directions. The projections form a plurality of projection pairs, each of which is extending in an opposite direction from an axial center of the head. The plurality of projection pairs include a primary projection pair having the largest length and a secondary projection pair having the second largest length. The length of the primary projection pair is equal to or larger than an inside diameter of the through hole. The length of the secondary projection is smaller than the inside diameter of the through hole.

The head of the conductive pin is provided with the primary projection pair and the secondary projection pair. Similar to the first aspect of the invention, the head can be smoothly inserted into the through hole along the axial center thereof without damaging the inner wall of the through hole. The thus inserted head is firmly secured to the through hole, thus preventing the conductive pin from falling off.

The head of the conductive pin is provided with 4 or more projections including the primary and the secondary projection pairs. So the solder gap between the projection and the through hole is filled with the solder for bonding them together.

The solder material is a solder paste formed of solder particles, flux, or the like or a solder.

According to the eleventh aspect of the invention, it is preferable that the conductive pin is provided with a collar under the projection. The collar has a groove formed on a surface abutting on the insulating substrate across the width of the collar. The head is inserted into the through hole by keeping the abutting surface of the collar on the insulating board. Then the solder material is applied in a direction opposite to that of inserting the head of the conductive pin. The reason is the same as described in the fourth aspect of the invention.

According to the twelfth aspect of the invention, the head is inserted into the through hole from one opening section thereof and the solder material is off-set mounted on a surface of the insulating substrate so as to cover the other opening section of the through hole partially. Then the solder material is melted and applied into the solder gap for securing the head of the conductive pin in the through hole.

Figure 11:
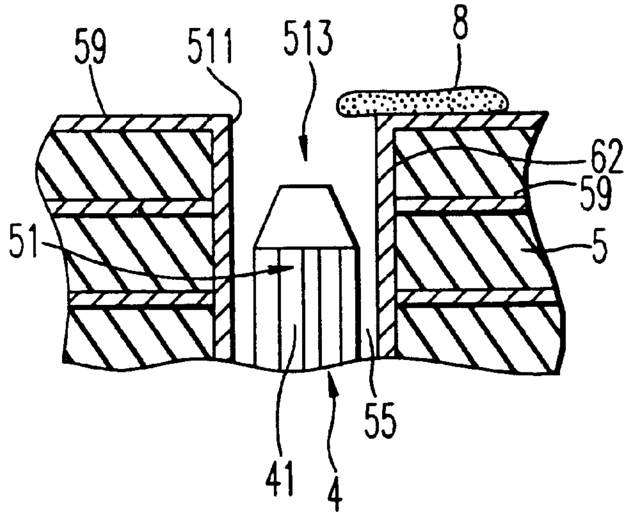
FIG. 11 is a vertical sectional view of the through hole where the solder material is off-set mounted to partially cover an open section of the through hole in Embodiment 4.
Figure 12:
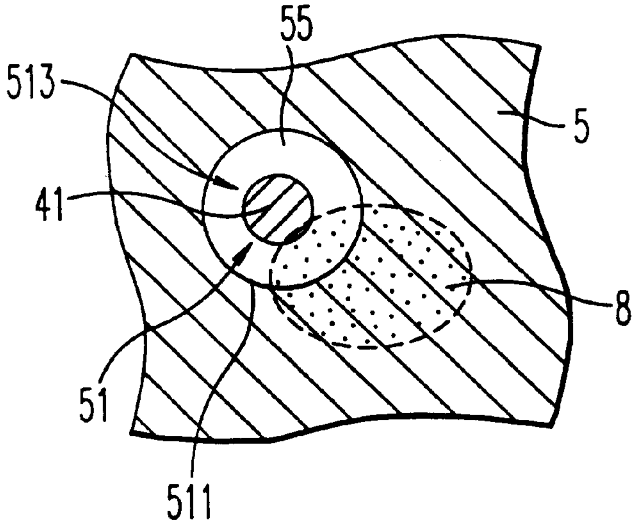
FIG. 12 is a plan view of the through hole where the solder material is off-set mounted to partially cover the open section of the through hole in Embodiment 4.

As shown in FIGS. 11 and 12, the solder material is off-set mounted so that only a part of opening section of the through hole is covered. The thus off-set solder material is melted and filled into the through hole.

Figure 13:
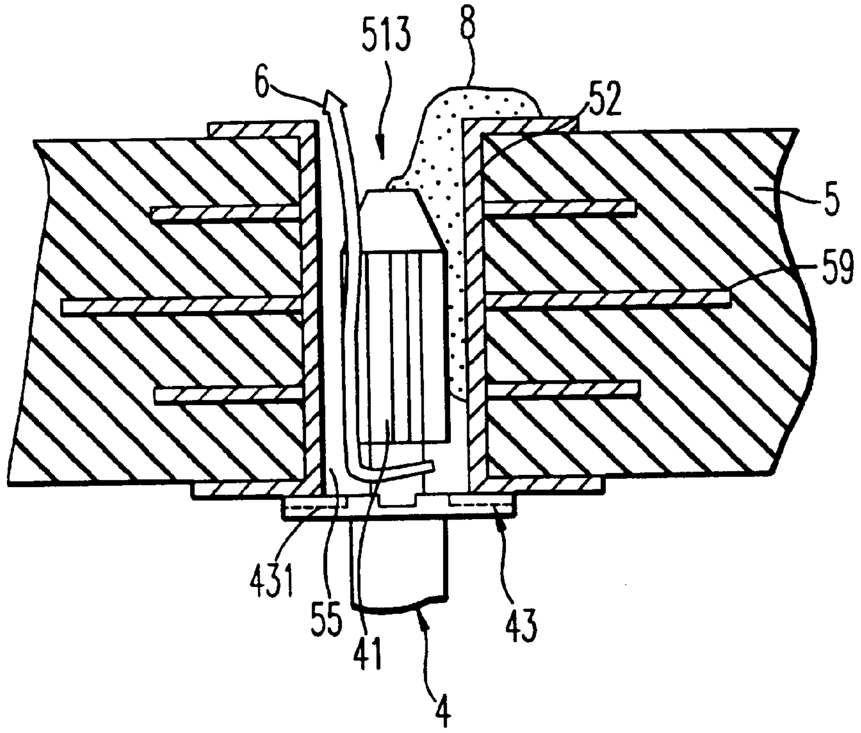
FIG. 13 is an explanatory view of Embodiment 4 showing the solder flow into the through hole.

Then the air trapped in the solder gap within the through hole is exhausted from the other part of the opening uncoated with the solder material to the outside (See FIG. 13). Therefore the solder can be uniformly filled with the solder gap. The formation of the cavity like solder void is also prevented.

The thirteenth aspect of the invention is realized by a conductive pin having a head which is inserted into a trough hole of the substrate for mounting an electronic part and a leg. The head of the conductive pin has projections with its side wall, radially projecting in 4 or more directions. Those projections form a plurality of projection pairs each extending in opposite directions from an axial center of the head. Those projections include a primary projection pair (longest) and the secondary projection pair (second longest). The primary projection pair has the length equal to or more than the diameter of the through hole. The secondary projection pair has a length less than the inner diameter of the through hole.

The conductive pin is provided with 4 or more projections including the primary and the secondary projection pairs. As described in the first aspect of the invention, the conductive pin can be inserted into a through hole smoothly as well as preventing the conductive pin from falling off. The conductive pin specified by the 14th to 21st aspects of the present invention has the same features as described in the 2nd to 9th aspect of the present invention.

DETAILED DESCRIPTION OF THE EMBODIMENT

Embodiment 1

Embodiments of a substrate for mounting electronic parts of the present invention are described referring to FIGS. 1 to 7.

Figure 5:
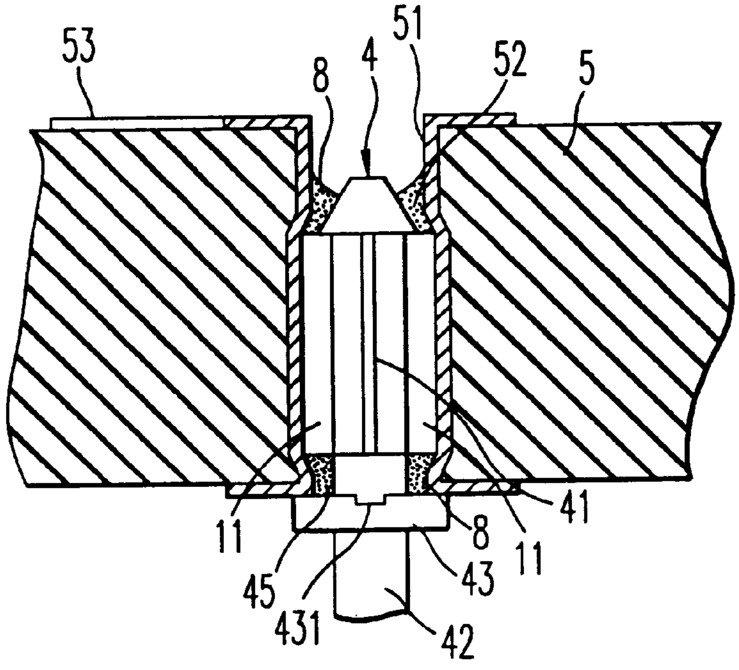
FIG. 5 is an explanatory view of Embodiments 1 and 2 showing a primary projection pair of the head of the conductive pin slightly pressing an inner wall of the through hole.
Figure 6:
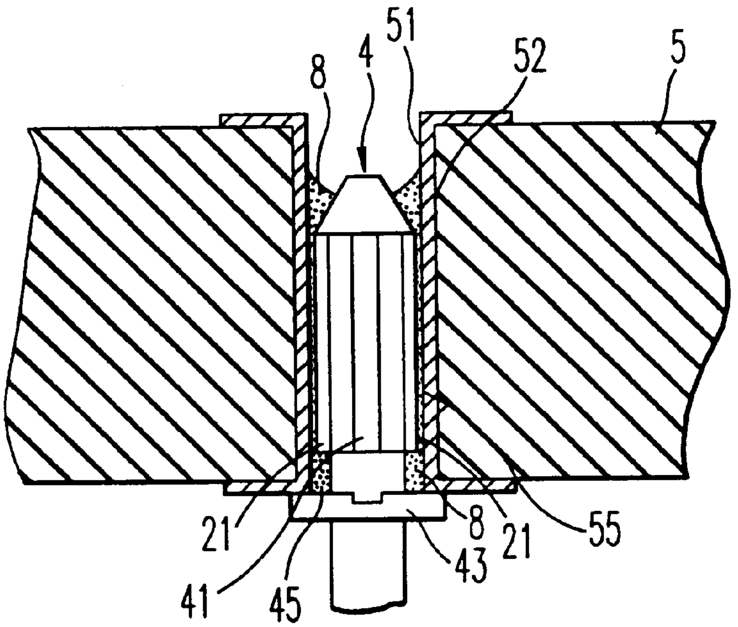
FIG. 6 is an explanatory view of Embodiments 1 and 2 showing a secondary projection pair of the head of the conductive pin smoothly inserted into the through hole, leaving a gap between the secondary projection pair and the inner wall of the through hole.

As FIGS. 1, 5 and 6 shows, the substrate for mounting electronic parts of the present invention is formed of an insulating substrate 5 on which a conductive circuit 53 is mounted, a through hole 51 piercing the insulating substrate 5 and a conductive pin 4 having its head 41 inserted into the through hole 51.

As FIGS. 1, 2, 5 and 6 show, the head 41 of the conductive pin 4 has a plurality of projections 11, 21, 31 and 32, each provided with the side wall of the conductive pin 4 and projecting radially in 4 or more directions. Those projections form projection pairs 10, 20, 310 and 320, each projection of which extends in opposite direction from an axial center of the head 41.

Figure 7:
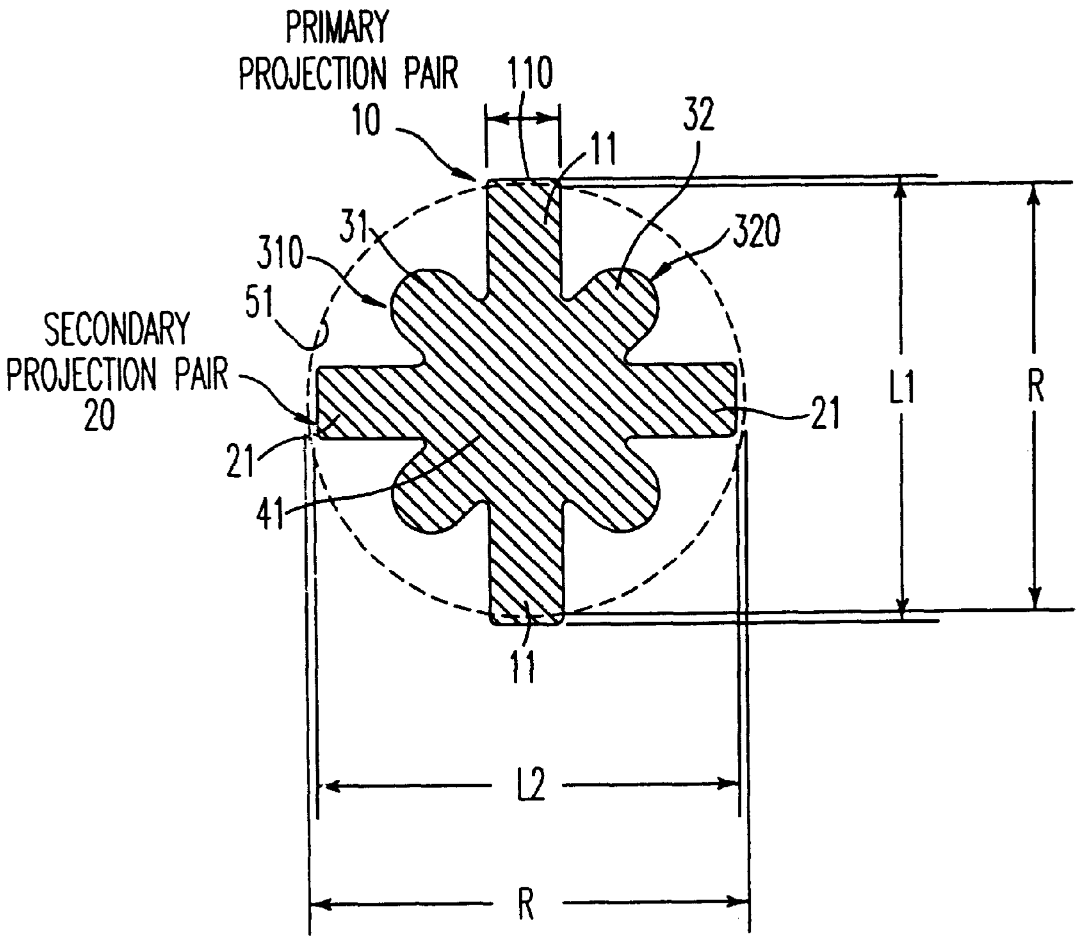
FIG. 7 is an explanatory view of Embodiments 1 and 2 showing each length of the respective projection pairs of the head of the conductive pin inserted into the through hole.

The projection pair 10 has the longest length. The projection pair 20 has the second largest length. As shown in FIG. 7, the projection pair 10 has a length L1 equal to. or more than that of an inside diameter R of the through hole 51. The projection pair 20 has a length L2 less than that of the inside diameter R of the through hole 51.

An inner wall surface of the through hole 51 is coated with a metal (gold or the like) plating layer 52 as FIG. 5 shows.

The conductive pin 4 is formed of the head 41, a leg 42 provided under the head 41 and a collar 43 provided between the head 41 and the leg 42. A solder sink section 45 is formed between the collar 43 and the projections 11, 21, 31 and 32.

Referring to FIG. 1, pairs of projections 11, 21, 31 and 32, i.e., 8 projections, are provided with the side wall of the head 41. Each projection of the respective projection pairs, 11, 21, 31 and 32 diametrically extends in an opposite direction from an axial center, thus forming projection pairs 10, 20, 310 and 320, respectively.

As FIGS. 1 and 7 show, among those projection pairs, the longest projection pair, primary projection pair 10, has the length L1 equal to or more than the inside diameter R of the through hole 51. The second longest projection pair, secondary projection pair 20, has the length L2 less than the inside diameter R of the through hole 51.

A solder gap 55 is defined between the through hole 51 and the conductive pin 41. The solder gap 55 is a space accommodating a virtual inscribed circle 57 contacting with the primary projection pair 10 and the inner wall surface of the through hole 51 as shown in FIG. 1. The diameter of the inscribed circle ranges from 0.03 to 0.12 mm.

Projection pairs 310 and 320 are further arranged between the primary projection pair 10 and the secondary projection pair 20. Each of the projection pairs 310 and 320 has the same length. Each of those projections 11, 21, 31, 32 and the collar 43 is produced by caulking a pillar-shaped article.

An upper surface of the collar 43, i.e., the surface abutting on the back surface of the insulating substrate 5 has a groove 431 formed across the width of the collar 43 as shown in FIGS. 2 to 5.

In this embodiment, the conductive pin 4 was prepared by using covar. The length L1 of the primary projection pair 10 was 585 μm. The length L2 of the secondary projection pair 20 was 550 μm. Therefore the difference between the L1 and L2 (L1–L2) was 35 μm.

A width D of a tip 110 of the projection 11 of the primary projection pair 10 was set to 100 μm (FIG. 7). In this embodiment, the tip 110 was formed into a plane surface by chamfering each corner. The length of the solder sink section 45 was 0.25 mm, 12.5% of the through hole length (2 mm).

In this embodiment, 8 projections 11, 21, 31 and 32 were provided with the head 41 of the conductive pin 4, each projecting radially in 8 directions. The primary projection pair 10 has the length L1 equal to or more than the inside diameter R of the through hole 51. The secondary projection pair 20 has the length L2 less than the inside diameter R of the through hole 51.

The head 41 of the conductive pin 4 can be smoothly inserted into the through hole 51 guided by the above projections.

Those projections form the respective projection pairs including the primary projection pair 10 and the secondary projection pair 20. When the head 41 is inserted into the through hole 51, the primary projection pair 10 exerts a slight pressure to the inner wall of the through hole (FIG. 5). Therefore the head 41 can be firmly secured to the through hole 51.

While the secondary projection pair 20 does not press the inner wall of the through hole 51 (FIG. 6). So the distortion of the inner wall of the through hole 51 owing to the pressure exerted by the primary projection pair 10 is absorbed at a point of the inner wall faced by the secondary projection pair 20, thus preventing the inner wall of the through hole 51 from being damaged.

Figure 17:
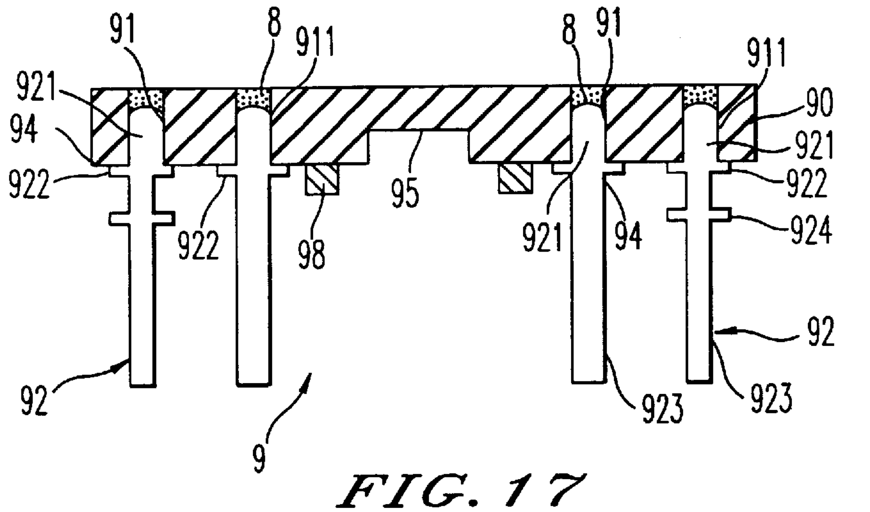
FIG. 17 PRIOR ART
FIG. 17 is a vertical sectional view of the conventional substrate for mounting an electronic part.
Figure 18:
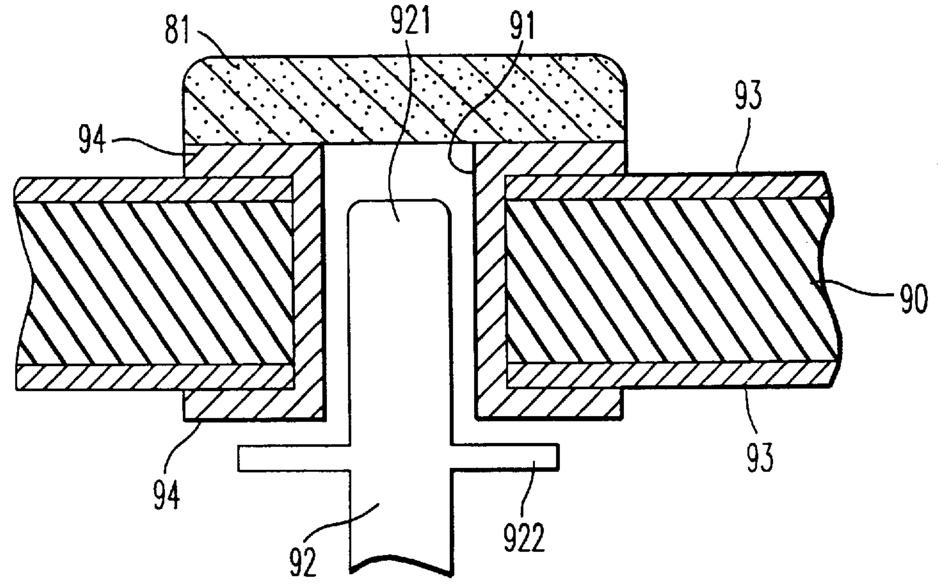
FIG. 18 PRIOR ART
FIG. 18 is a vertical sectional view of a through hole into which the conductive pin has been inserted where the solder is applied in a conventional manner.

The solder gap 55 defined between 8 projections 11, 21, 31, 32 and the inner wall surface of the through hole 51 is filled with the solder 8 (see FIG. 17, prior art). The solder 8 is partitioned into 8 wave-like sections by those 8 projections (FIGS. 1, 5 and 6). The solder 8 serves to bond the projections and the through hole and secure the conductive pin 4 firmly, thus providing electric reliability for an extended period.

This embodiment provides a substrate for mounting electronic parts, allowing for secure insertion and fixation of the conductive pin 4 without damaging the through hole 51.

Embodiment 2

The Embodiment 2 relates to a groove 431 formed in a collar of the conductive pin of Embodiment 1.

Referring to FIGS. 2 to 6, with respect to the substrate for mounting electronic parts of Embodiment 2, the gross section area of all the grooves 431 formed in the collar 43 was set to 6.7% of the gross section area of the solder gap 55.

Figure 4:
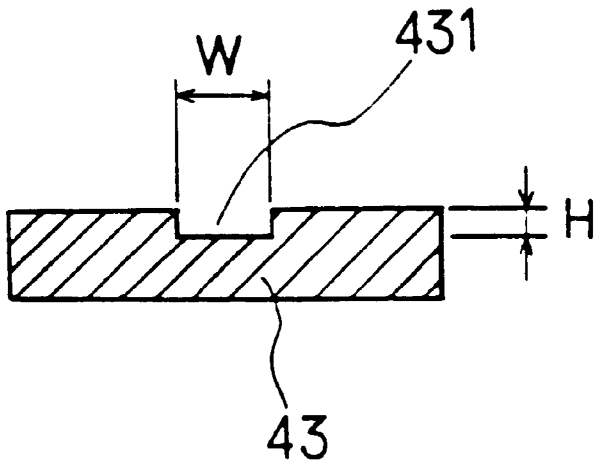
FIG. 4 is a sectional view taken on line C—C of FIG. 2 of Embodiments 1 and 2.

As FIG. 4 shows, the groove 431 had a depth H of 10 μm and a width W of 150 μm. The section area of the groove 431 resulted in 1500 $\mu m^2$. As 4 grooves 431 were formed in the collar, the gross section area of the grooves 431 resulted in 6000 $\mu m^2$ (1500×4).

As FIGS. 1 and 7 show, the inside diameter R of the through hole 51 was 570 μm. Since the projections of the head of the conductive pin were formed by squeezing the material with its element wire diameter of 460 μm, the section area of the head of the conductive pin was derived from $\pi\times(460/2)^2\ \mu m^2$. Therefore the gross section area of the solder gap defined by the through hole 51 and the head 41 of the conductive pin was derived from the following equation:

$$\pi\times(570/2)^2-\pi\times(460/2)^2=88{,}986\ \mu m^2.$$

The ratio of the gross section area of all the grooves to that of the solder gap can be ranged as described above. In this embodiment, the ratio of a section area of one groove (section area of the groove 431=1500 mm) to the gross section area of the solder gap resulted in 1.7%.

The molten solder moved down toward the groove 431 of the collar 43 through the solder gap 55 between the inner wall surface of the through hole 51 and the head 41 by forcing the air trapped within the solder gap 55 downward.

As the ratio of the gross section area of the grooves 431 to the solder gap 55 has been specified as aforementioned, the solder gap 55 can be filled with the solder without causing any void within the applied solder 8.

As the molten solder is prevented from overflowing from the groove 431 to the outside of the through hole 51, no solder is adhered to the adjacent conductive pin.

As described above, the molten solder can be filled in the gap between the head 41 of the conductive pin 4 and the through 51 reliably. So the conductive pin is inserted and secured into the through hole without causing any damage thereto.

Embodiment 3

Figure 8:
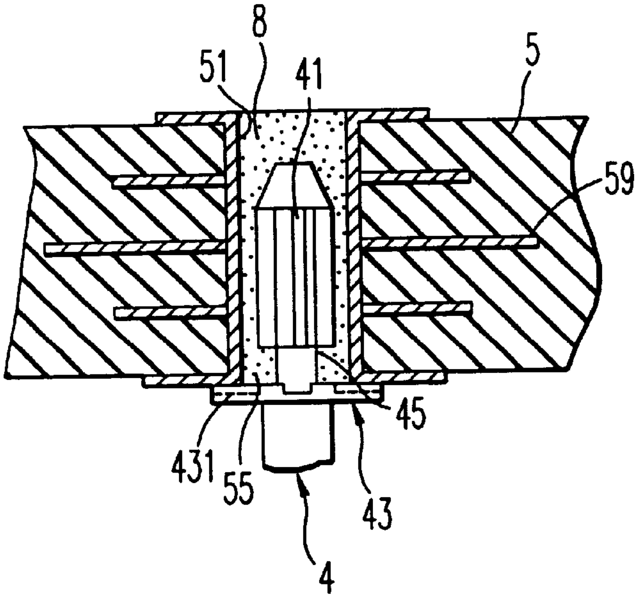
FIG. 8 is a vertical sectional view of the through hole where the solder flows in a good condition in Embodiment 3.
Figure 9:
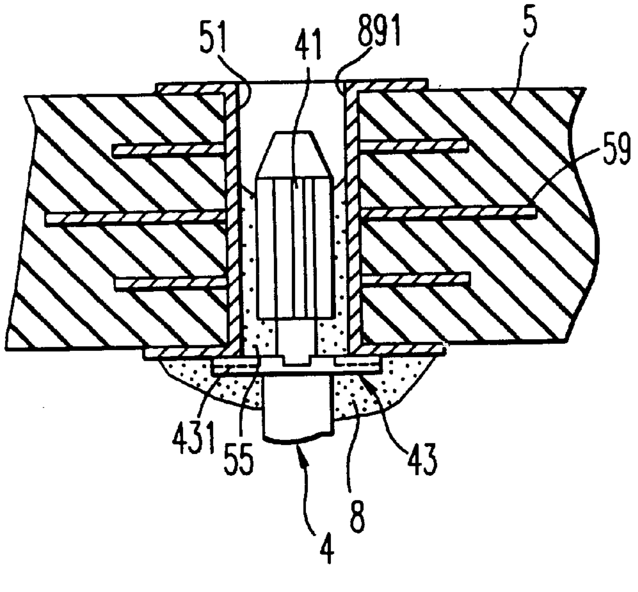
FIG. 9 is a vertical sectional view of the through hole where the solder overflows.
Figure 10:
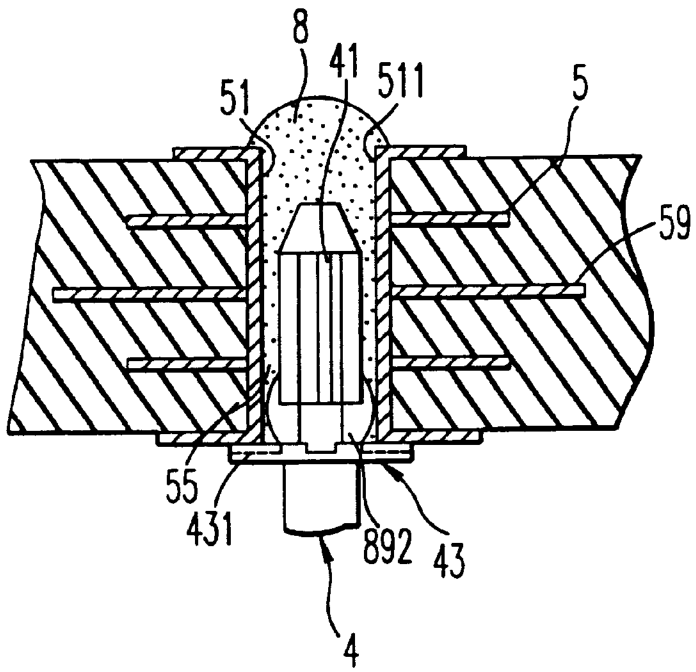
FIG. 10 is a vertical sectional view of the through hole where the residual solder is built up on top of the through hole.

As FIGS. 8 to 10 and Table 1 show, a relationship between the section area of the groove and the solder flow through the through hole has been researched in Referring to FIG. 4, 5 types of conductive pins were prepared by varying the depth H of the groove to 55 μm, 35 μm, 20 μm, 2 μm and 0 μm, respectively. While the width W of the groove was fixed to 250 μm. Inserting those conductive pins each having different depth H into the through hole, 5 kinds of substrates for mounting electronic parts were prepared. Those substrates are referred to as samples A, B, C, D and E, respectively.

The gross section area of the solder gap was set to 88986 $\mu m^2$ in the same way as in Embodiment 2. Table 1 shows the ratio of a section area of one groove to the gross section area of the solder gap and the ratio of gross section area of all grooves to that of the solder gap. Each of the above-prepared conductive pins was inserted into the through hole and the solder was filled thereinto. A cross section of the through hole part of the substrate was taken, which was then observed by a microscope (×50) to see the extent of filling of the solder in the through hole. The observation results are shown in Table 1 and FIGS. 8 to 10.

In case of samples A to D, the solder flow was observed with respect to 8584 through holes. In case of the sample E, the solder flow was observed with respect to 8580 through holes. Table 1 shows the number of through holes where the solder spill occurred by the range of spill. The term "solder spill" means that the solder flowing into the through hole overflows from the groove and then adheres to the adjacent conductive pin. The condition of the solder spill was judged. In case of no solder spill, it was judged as "excellent" ⊙. In case of the solder spill equal to or less than 0.2 mm, it was judged as "good" ○. In case the number of through holes where the solder spill of 0.2 mm or less occurred is 5 or more, or the number of through holes where the solder spill of 0.2 mm or more occurred is 1 or more, it was judged as "no good" X.

The solder flow toward the collar is defined by the solder flow rate. In case of no solder flow to the groove of the collar and generation of the void, it was judged as "none". In case of no fillet nor generation of the void, it was judged as "small". In case the solder was filled in the whole groove and no void was generated (normal condition), it was judged as "medium". In case the solder was adhered to the surface of the collar, it was judged as "large". In case the solder adhered to the leg of the conductive pin, it was judged as "excessive". When the solder flow was judged as "medium", "none" and "excessive", each condition is marked as ○, Δ, and X, respectively. The samples A to E were classified by the aforementioned solder condition. In case those samples have no through hole corresponding to the respective levels, it was marked as "c". In case they have a small number of the corresponding through holes, it was marked as "b". In case they have a large number of the corresponding through holes, it was marked as "a".

TABLE 1

| Sample | Depth of the groove (μm) | Ratio of a section area of one groove*1 (%) | Ratio of a section area of all grooves*2 (%) | Solder spill: The range of solder spill (mm) ~0.1 | ~0.2 | 0.2~ | Solder spill: Judgment | Solder flow to the collar: Solder flow rate[*4] none | small | medium | large | excessive | Solder flow to the collar: Judgment | Total judgment |
|---|---|---|---|---|---|---|---|---|---|---|---|---|---|---|
| A | 55 | 15.5 | 62.0 | Large amount | Large amount | Large amount | X | c | c | b | a | b | X | X |
| B | 35 | 9.8 | 39.2 | 0/8584 | 0/8584 | 0/8584 | ○ | c | b | b | b | c | ○ | ○ |
| C | 20 | 5.6 | 22.4 | 0/8584 | 2/8584 | 0/8584 | ○ | c | b | a | b | c | ○ | ○ |
| D | 2 | 0.56 | 2.24 | 0/8584 | 2/8584 | 0/8584 | ○ | c | b | a | b | c | ○ | ○ |
| E | 0 | 0 | 0 | 0/8580 | 0/8580 | 0/8580 | ◎ | a | b | b | b | c | Δ | Δ |
| | | | | Allowable as "good"[*3] | | | | | | | | | | |

*1 A ratio of a section area of one of 4 grooves formed in the collar to the gross section area of the solder gap.
*2 A ratio of the gross section area of 4 grooves formed in the collar to the gross section area of the solder gap.
[*3]The solder spill range equal to or less than 0.2 mm is judged as allowable (good).
[*4]"a", "b" and "c" shown in the column of the solder flow rate denote the respective quantities of the through holes from where each solder of the respective levels overflows.
"a": A large number of the corresponding through holes
"b": A small number of the corresponding through holes
"c": No corresponding through hole From the above results, the solder flow into the through hole of each sample was totally judged as Table 2 shows. That is, unless the conditions of the solder spill and the solder flow to the collar were judged as Δ nor X, it can be totally judged as ○. In case of no X but judged as Δ, it can be totally judged as Δ. In case either condition was judged as X, it can be totally judged as X.

In case of samples B, C and D in which the depth of the groove ranged from 2 to 40 μm, the solder flow into the through hole was judged as good and the solder spill never occurred.

In case of sample A in which the depth of the groove was 55 μm, the solder moved to the outside of the through hole 51 via the groove 431, leaving the upper section of the solder gap unsoldered as FIG. 9 shows.

In case of sample E setting the depth of the groove to 0, i.e., no groove, all the solder mounted on the through hole 51 did not flow through the solder gap 55 of the through hole 51, leaving the residual solder 8 built up on an open section 511 of the through hole 51. A void 892 was formed within the solder along the direction for inserting the conductive pin 4.

A reference numeral 59 used in FIGS. 8 to 10 denotes an inner layer conductive circuit provided inside the insulating substrate 5.

If the depth of the groove ranges from 2 to 40 μm, that is, the ratio of an section area of one groove to the gross section area of the solder gap ranges from 0.56 to 9.8% and the ratio of the gross section area of all grooves to that of the solder gap ranges from 2.24 to 39.2%, no solder spill nor solder void occurs, thus allowing for uniform solder flow all through the solder gap.

TABLE 2

Criteria for total judgment

| judgment for solder spill | judgment for solder flow to the collar | total judgment |
|---|---|---|
| x | x | x |
| x | Δ | |
| x | ○ | |
| Δ | x | |
| ○ | x | |
| ◎ | x | |
| Δ | Δ | Δ |
| Δ | ○ | |
| ○ | Δ | |
| ◎ | Δ | |
| ○ | ○ | ○ |
| ◎ | ○ | |

Embodiment 4

In this embodiment, the solder material as the solder 8 was off-set mounted on the through hole 51 so as to cover only a certain part of an open section 511 of the through hole 51 as shown in FIGS. 11 and 12.

Conductive circuits 59 were provided on the surface and inside of the insulating substrate 5, respectively. The inner wall of the through hole 51 was coated with a metallic plating layer 52. Then the head 41 of the conductive pin was inserted into the through hole 51. The solder 8 was off-set mounted on the through hole 51 so as to cover a certain part of an open section 511 of the through hole 51 on the other surface of the insulating substrate, i.e., opposite to the surface to which the conductive pin 4 was inserted. The solder 8 was in the form of a solder paste containing the solder particles and flux, which was set through off-set printing process.

As FIG. 13 shows, the solder 8 was heated into molten state so as to be applied into the solder gap 55 between the through hole 51 and the conductive pin 4. As a result, a substrate for mounting electronic parts having the conductive pin 4 secured within the through hole 51 was prepared.

In Embodiment 4, the solder was off-set mounted so as to cover a certain part of the open section 511 of the through hole 51. An uncovered part 513 of the open section 511 (not covered with the solder 8) allowed the air to flow in/out.

Referring to FIG. 13, the air 6 trapped within the solder gap 55 of the through hole 51 was efficiently exhausted from the uncovered part 513. The air was also exhausted through the groove 431 formed in the collar 43. Therefore the solder 8 was allowed to be filled in the solder gap 55 uniformly. Additionally no solder void was formed within the solder gap filled with the solder.

Embodiment 5

Figure 14:
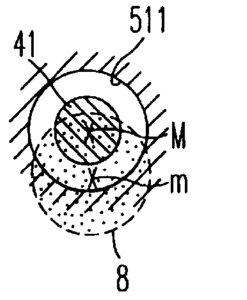
FIG. 14 is a table showing results of the solder printing tests executed in Embodiment 5.
Figure 14:
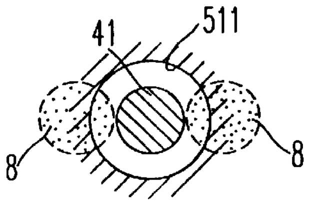
Figure 14:
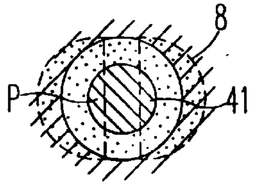
Figure 15:
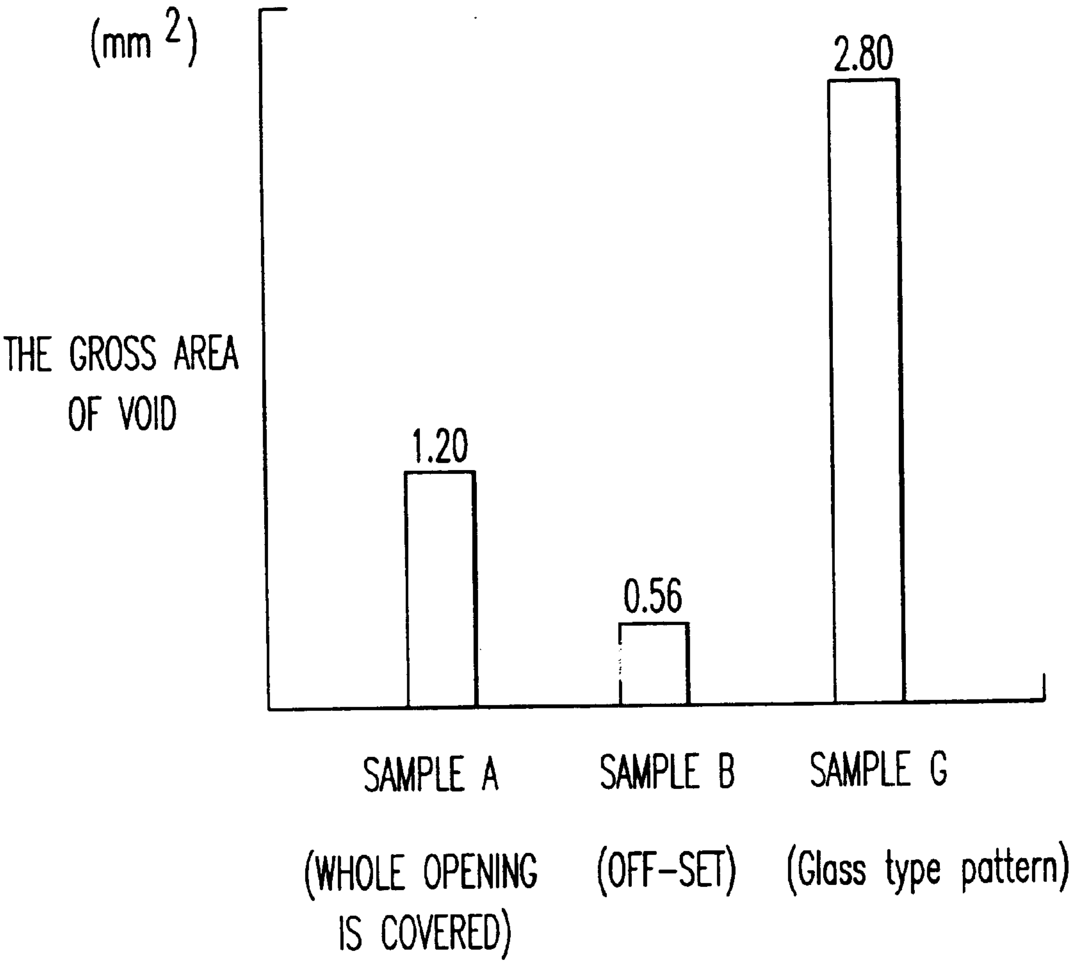
FIG. 15 is a graphical representation showing each relationship between the total section area of the void and the respective samples a, b and g.
Figure 16:
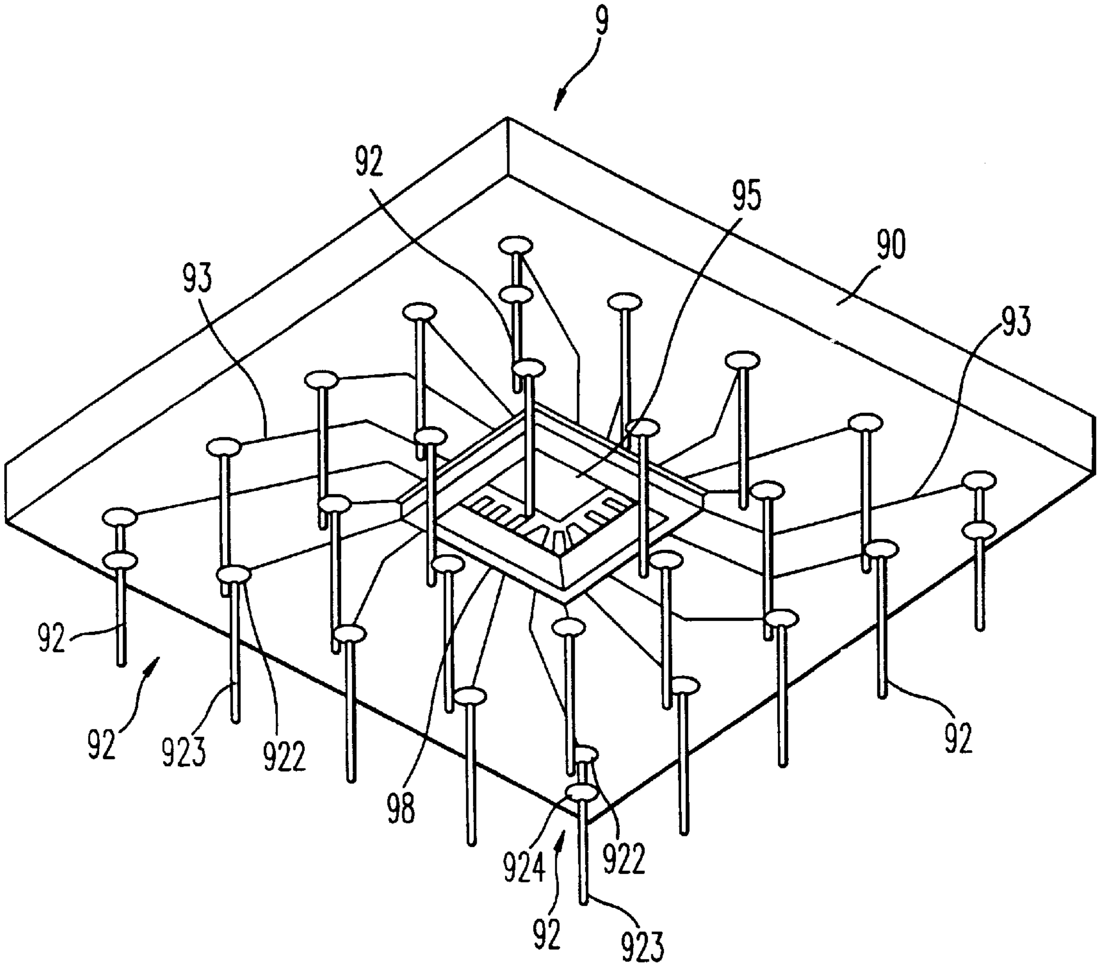
FIG. 16 PRIOR ART
FIG. 16 is a schematic view of a back surface of a conventional substrate for mounting electronic parts with the conductive pins inserted thereto.

Referring to FIGS. 14 and 15, this embodiment researched a relationship between the set position of the solder and the solder flow within the through hole.

As shown in FIG. 14, the solder was printed in three printing patterns, a single circle pattern for setting the whole solder at one position, a glass type pattern for dividing the solder into two and setting each solder at two positions facing each other with the through hole between, and a semi-circle pattern for setting each of half solder around the half periphery of the through hole, respectively. Then 8 samples a to f, g and h were prepared.

A center m of the solder 8 of the single circle pattern was shifted (off-set) from a center M of the open section 511 of the through hole by 0 to 0.6 mm. As for the glass type pattern, the solder 8 was so set to cover a left end and a right end of the open section 511 of the through hole. As for the semi-circle pattern, the solder 8 was so set to cover a certain part of the left end and the right end of the open section 511 of the through hole, leaving 0.3 mm of a center part P of the open section 511. The solder paste was used as the solder 8.

After setting the solder through the respective printing patterns, the solder was heated into a molten state and filled into the solder gap of the through hole.

A cross section of the through hole part of the substrate was taken, which was then observed by a microscope (×50) to see the extent of filling of the solder in the through hole. The observation results are shown in FIGS. 14 to 15.

Referring to FIG. 14, the term "printing stability" was set as an index, based on which it was judged as to stability of the solder printing. When the printing stability was judged as excellent, it was marked as ◎. When it was judged as good, it was marked as 0. When it was judged as no good, it was marked as X. The term "solder amount" denotes as the amount of the solder set on the open section of one through hole. As for the single circle pattern, the solder amount was defined as a diameter of the solder circle. As for the glass type pattern, it was defined as each diameter of the respective solder circles. As for the semi-circle pattern, it was defined as a diameter of the semi-circle of the solder.

The term "off-set amount" denotes the distance between the center of the single circle of the solder 8 and a center of the open section 511. The term "gross area of void" denotes a gross area of the solder void found on a cutting surface of a through hole in a diametric direction thereof. The term "land wet" denotes the range in which the land got wet while heating the solder into a molten state. If the whole surface of the land at the solder supply side was covered with the solder, it was judged as 0. If the metal plating layer coating the land was exposed, it was judged as X.

The term "convex pin" denotes the condition that the solder of the through hole at the solder supply side is swelled. The term "concave pin" denotes the condition that the through hole is not sufficiently filled with the solder, forming a hole therein along its length.

Referring to FIGS. 14 and 15, in case of the single circle pattern for off-setting the solder (samples b, d, e and f), the printing stability became excellent and only a few solder voids occurred compared to the glass type and semi-circle patterns (samples g and h). In case the off-set amount was set to 0 (samples a and c), i.e., the whole open section of the through hole was covered with the solder paste, a large amount of the solder void occurred.

As described above, the present invention provides a substrate for mounting electronic parts as well as a method for producing the same, allowing for reliable insertion and fixation within the through hole and yet causing no damage to the through hole.

What is claimed is:

1. A substrate for mounting an electronic part comprising:

an insulating substrate provided with a conductive circuit, said insulating substrate having a through hole;

a conductive pin having a leg and a head inserted into said through hole, wherein said head of said conductive pin includes a plurality of projections at its side wall, each projecting radially in 4 or more directions, said projections forming a plurality of projection pairs, each projection of which is extending in an opposite direction from an axial center of said head, said projection pairs including a primary projection pair having the largest length and a secondary projection pair having the next largest length, said length of said primary projection pair is equal to or more than an inside diameter of said through hole, wherein said primary and secondary projection pairs are configured such that they do not deform upon insertion into said through hole;

wherein said primary and secondary projection pairs are configured such that said primary projection pair causes an outward deformation of said through hole aligned generally with said primary projection pair, and an inward deformation aligned generally with said secondary projection pair;

wherein said secondary projection pair is configured to allow said through hole to deform inwardly in response to the outward deformation caused by said primary projection pair.

2. The substrate of claim 1, wherein said length of said secondary projection pair is less than said inside diameter of said through hole.

3. The substrate of claim 1, wherein a width of a tip of each projection forming said primary projection pair ranges from 50 to 200 $\mu$m.

4. The substrate of claim 1, wherein a difference of length between said primary projection pair and said secondary projection pair ranges from 10 to 70 $\mu$m.

5. The substrate of claim 1, wherein a solder gap defined by said through hole and said conductive pin has a space accommodating a virtual inscribed circle contacting with said primary projection pair and said through hole and a diameter of said inscribed circle ranges from 0.03 to 0.12 mm.

6. The substrate of claim 1, wherein said conductive pin is provided with a collar abutting on said insulating substrate under said projections, said collar has at least one groove formed in its surface abutting on said insulating substrate across a width of said collar; and a solder gap defined by said through hole and said conductive pin is filled with a solder material in a direction opposite to that of inserting said conductive pin in order to solder bond said conductive pin and said through hole.

7. The substrate of claim 6, wherein a cross section area of all grooves formed in said collar ranges from 2 to 40% of a gross section area of said solder gap.

8. The substrate of claim 6, wherein a cross section area of one groove formed in said collar ranges from 0.5 to 10% of a gross section area of said solder gap.

9. The substrate of claim 6, wherein said head has a solder sink section provided between said projections and said collar, said solder sink section has no said projections provided therewith and has a length less than that of said secondary projection pair.

10. The substrate of claim 9, wherein a length of said solder sink section ranges from 2 to 35% of that of said through hole.

* * * * *